United States Patent
Ariki

(10) Patent No.: US 6,535,438 B2
(45) Date of Patent: Mar. 18, 2003

(54) SEMICONDUCTOR MEMORY DEVICE ADOPTING REDUNDANCY SYSTEM

(75) Inventor: Takuya Ariki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/955,020

(22) Filed: Sep. 19, 2001

(65) Prior Publication Data

US 2002/0136070 A1 Sep. 26, 2002

(30) Foreign Application Priority Data

Mar. 21, 2001 (JP) .................................. 2001-079767

(51) Int. Cl.[7] .............................................. G11C 7/00
(52) U.S. Cl. ................ 365/200; 365/189.07; 365/225.7
(58) Field of Search ............................ 365/200, 184.07, 365/225.7, 201

(56) References Cited

U.S. PATENT DOCUMENTS

| | | | | | |
|---|---|---|---|---|---|
| 5,278,839 | A | * | 1/1994 | Matsumoto et al. | ........ 714/710 |
| 5,343,429 | A | | 8/1994 | Nakayama et al. | |
| 5,631,868 | A | * | 5/1997 | Termullo et al. | ........... 365/200 |
| 5,801,986 | A | * | 9/1998 | Matsumoto et al. | ... 365/185.09 |
| 6,320,800 | B1 | * | 11/2001 | Saito et al. | ................. 365/200 |

FOREIGN PATENT DOCUMENTS

| | | |
|---|---|---|
| JP | 5-225796 | 9/1993 |
| JP | 11-33880 | 3/1999 |

* cited by examiner

Primary Examiner—Huan Hoang
(74) Attorney, Agent, or Firm—McDermott, Will & Emery

(57) ABSTRACT

A determination circuit included in a memory device determines availability to replace a defective cell within the memory device with a spare memory cell. An output signal indicating a result of determination is generated. Thus, even after the memory device is packaged, it can be easily determined whether a repair is possible by detecting the level of the output signal.

8 Claims, 12 Drawing Sheets

FIG.8
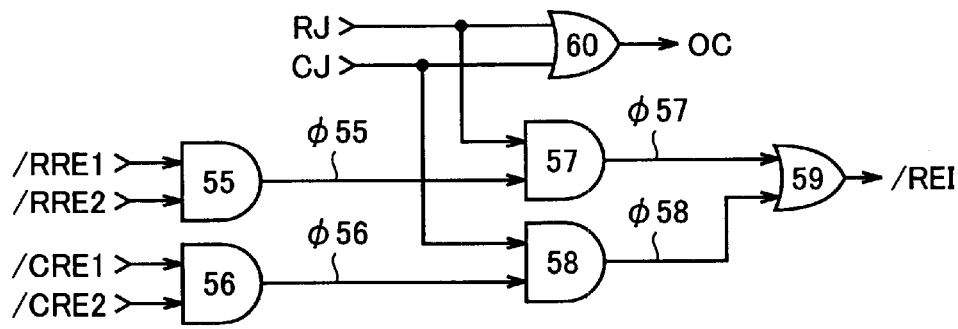
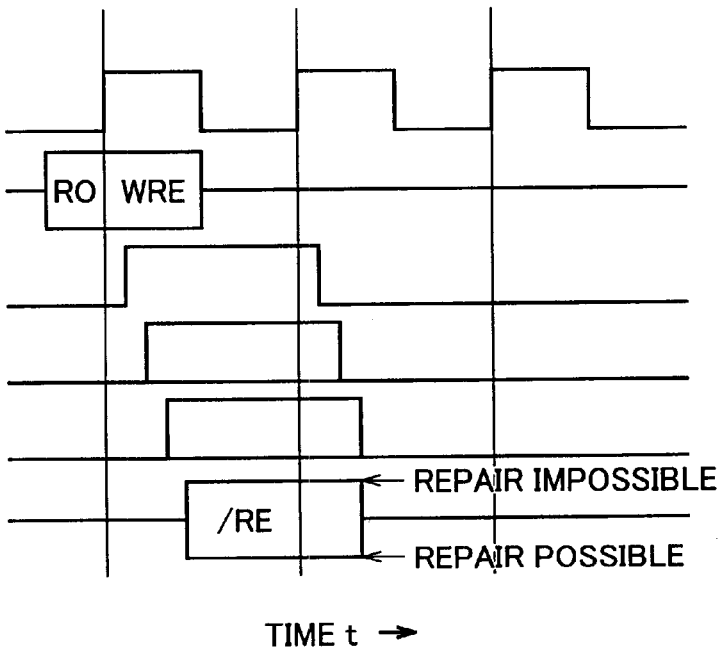

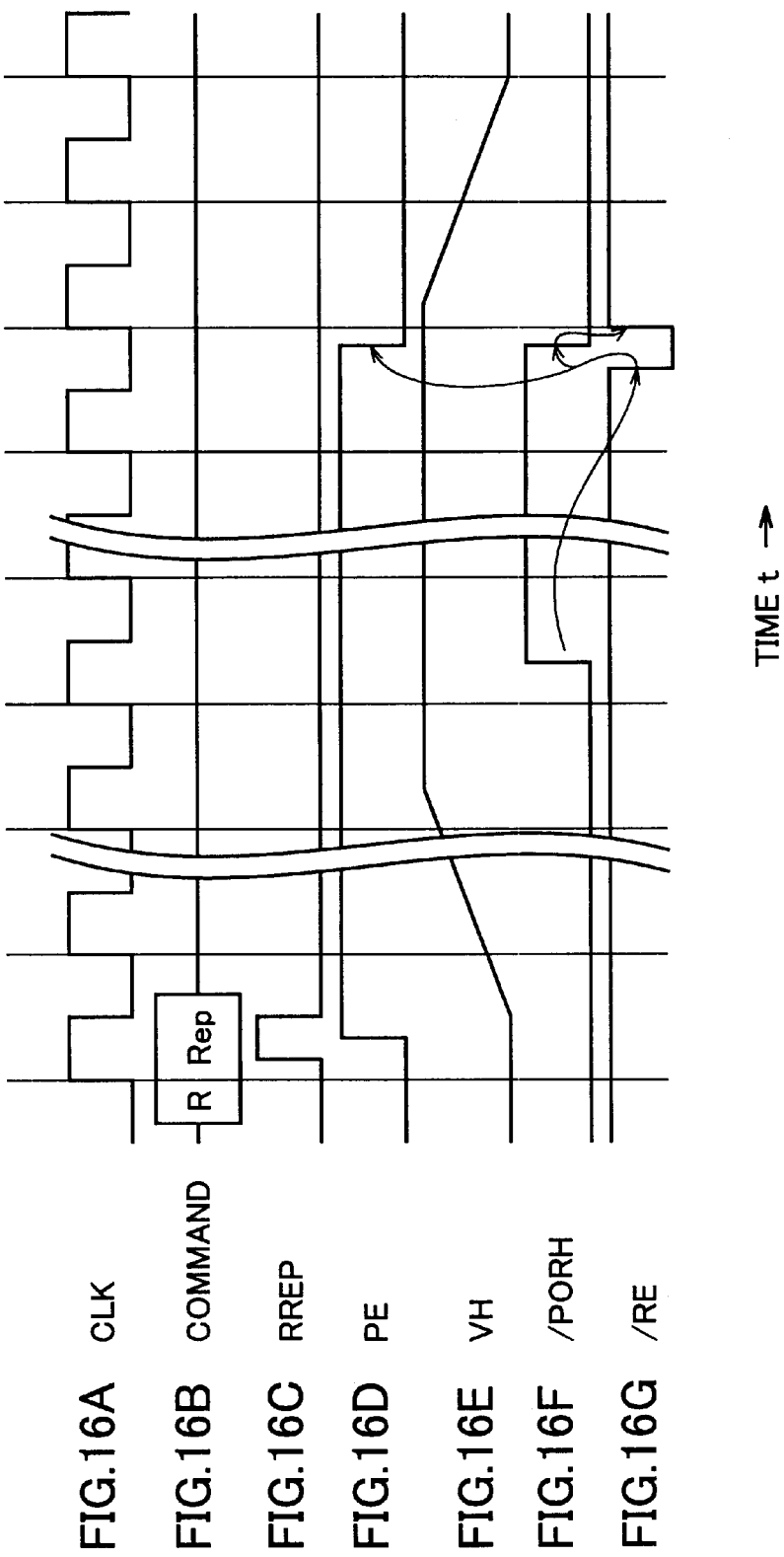

SEMICONDUCTOR MEMORY DEVICE ADOPTING REDUNDANCY SYSTEM

BACKGROUND OF THE INVENTION

1. Field of the Invention

The present invention relates to a semiconductor memory device, and more specifically, to a semiconductor memory device adopting a redundancy system in which a defective memory cell is replaced by a spare memory cell.

2. Description of the Background Art

Conventionally, in a semiconductor memory device such as a dynamic random access memory (hereinafter referred to as a DRAM), a redundancy system is adopted in which a defective row or column is replaced by a spare row or column. A plurality of fuses for programming an address signal corresponding to a defective row or column are provided in a semiconductor memory device, and these fuses are blown on the wafer using a laser beam. When the address signal programmed by a plurality of fuses is input, a spare row or column is selected in place of the defective row or column. Thus, according to the redundancy system, a semiconductor memory device having a defective row or column can be repaired, and the yield of the semiconductor memory devices can be improved.

In some cases, however, a defective row or column is discovered after a semiconductor memory device is packaged, and in such cases, the semiconductor memory device cannot be repaired by the conventional redundancy system. Thus, in the recent years, a redundancy system is being developed which allows replacement of a defective row or column with a spare row or column even after the semiconductor memory device is packaged by the use of an electric fuse that is blown by a high voltage. In particular, in a system such as a server that requires high reliability to be maintained, a redundancy system that allows repair of a semiconductor memory device even after the semiconductor memory device is packaged is required as part of the improvement of system reliability.

SUMMARY OF THE INVENTION

Thus, the main object of the present invention is to provide a semiconductor memory device which allows easy determination as to whether a defective memory cell can be replaced by a spare memory cell even after packaging.

According to the present invention, a semiconductor memory device is provided with a plurality of memory cells to each of which is assigned in advance a unique address signal, a spare memory cell for replacing a defective memory cell, a decoder for selecting one of the plurality of memory cells according to an address signal externally supplied, a programming circuit having at least one first fuse for programming an address signal of the defective memory cell for rendering the decoder inactive and for selecting the spare memory cell in response to the fact that the address signal externally supplied is being programmed by at least one second fuse, a write/read circuit for performing a write/read operation of data signals of the selected memory cell and the spare memory cell, and a first determination circuit for determining whether an address signal is programmed in the programming circuit and outputting a signal of a level according to the result of determination. Thus, by detecting the level of an output signal from the first determination circuit, it can easily be determined whether the replacement of a defective memory cell with a spare memory cell is possible even after the semiconductor memory device has been packaged.

Preferably, multiple sets of a spare memory cell and a programming circuit are provided, and the first determination circuit determines whether there is a programming circuit in which an address signal is not being programmed, and outputs a signal of the level according to the result of determination. In this case, by detecting the level of the output signal from the first determination circuit, it becomes possible to determine whether there is a programming circuit in which an address signal is not programmed among the plurality of programming circuits, and it can be easily determined whether the replacement of a defective memory cell with a spare memory cell is possible.

Preferably, a second determination circuit is further provided for determining whether there is a programming circuit in which an address signal for a defective memory cell found after a semiconductor memory device is packaged is programmed and for outputting a signal of a level according to the result of determination. In this case, it becomes possible to prevent the same address signal from being programmed in two or more programming circuits so that the simultaneous selection of two or more spare memory cells can be prevented.

Preferably, the first determination circuit determines that there is no programming circuit in which an address signal is not programmed regardless of whether there is a programming circuit in which an address signal is not programmed when the second determination circuit determines that there is a programming circuit in which the address signal for the defective memory cell found after the semiconductor memory device is packaged is programmed. In this case, by simply detecting the level of an output signal from the first determination circuit, it can be determined whether there is a programming circuit in which an address signal is not programmed among the plurality of programming circuits, and the simultaneous selection of two or more spare memory cells can be prevented.

Preferably, a plurality of registers are further provided, each corresponding to one of the plurality of programming circuits and including a second fuse which is blown when an address signal is programmed in the corresponding programming circuit, and each for outputting a signal of a first level when the second fuse is blown and a signal of a second level when the second fuse is not blown. The first determination circuit makes the determination based on the output signals from the plurality of registers. In this case, it can be easily determined whether there is a programming circuit in which an address signal is not programmed among the plurality of programming circuits by detecting the level of the output signals from the plurality of registers.

Preferably, a data input/output terminal for communicating a data signal between the write/read circuit and outside and a switching circuit for supplying to the data input/output terminal a data signal read by the write/read circuit during a read mode and for supplying to the data input/output terminal an output signal from the first determination circuit during a determination mode are further provided. In this case, the output signal from the first determination circuit can be taken out to the outside via the data input/output terminal so that there is no need separately to provide a terminal for taking out the output signal from the first determination circuit to the outside.

Preferably, a blow circuit is further provided for selectively blowing at least one first fuse to program an address signal for a defective memory cell. In this case, the defective memory cell can be easily replaced with a spare memory cell even after the semiconductor memory device has been packaged.

Preferably, a blow voltage generating circuit is further provided for generating a blow voltage for blowing a first fuse and applying the generated blow voltage to the first fuse via the blow circuit. In this case, there is no need separately to apply a blow voltage for blowing a fuse to the semiconductor memory device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a circuit diagram representing an arrangement of a determination circuit shown in FIG. 1.

FIGS. 9A to 9F are timing charts showing the operation during a row repair enable determination mode of the SDRAM shown in FIGS. 1 to 8.

FIGS. 16A to 16G are timing charts showing the operation during a row repair mode of the SDRAM shown in FIGS. 14 and 15.

DESCRIPTION OF THE PREFERRED EMBODIMENTS

First Embodiment

Figure 1:
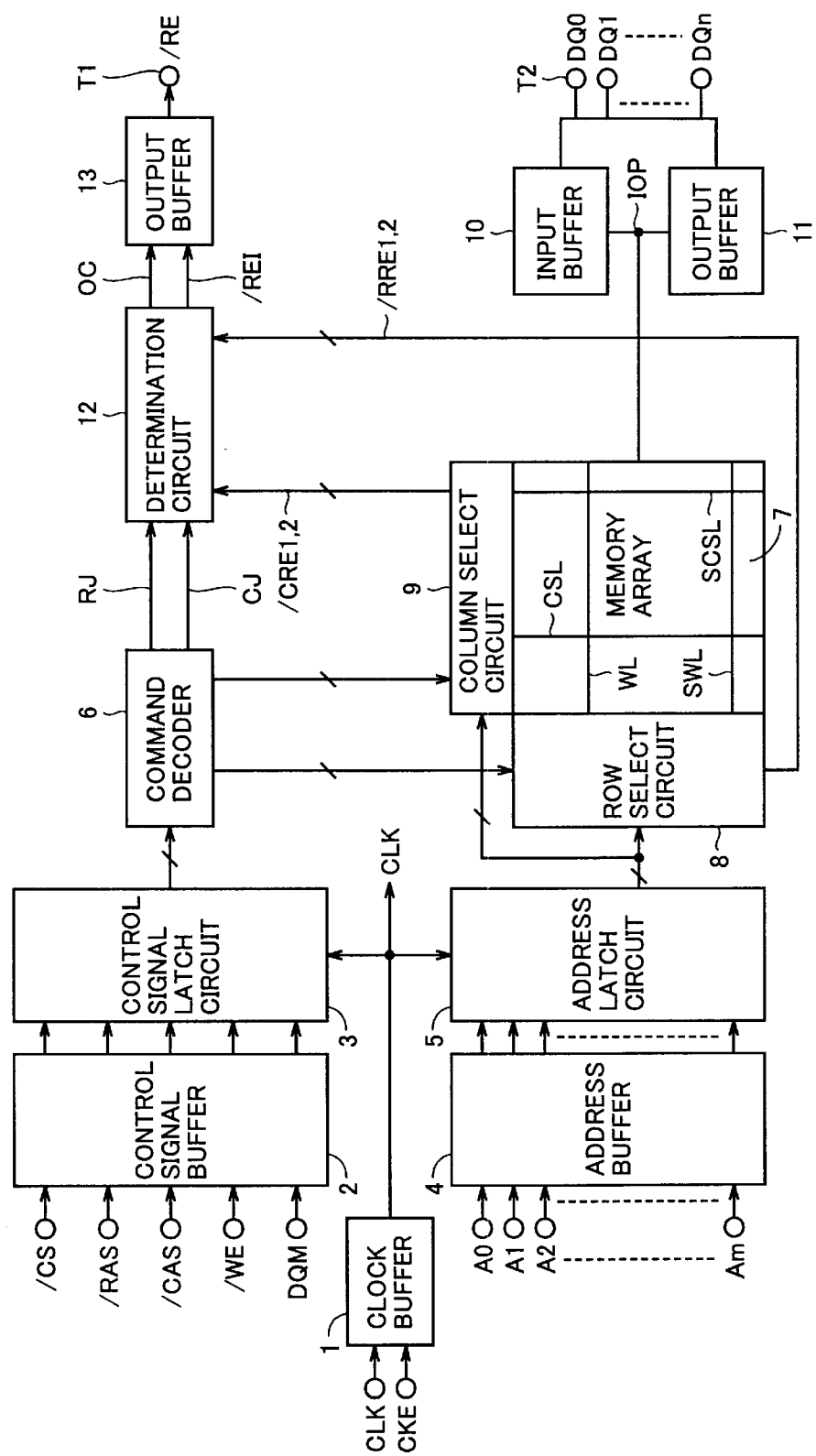
FIG. 1 is a block diagram representing an overall configuration of an SDRAM according to a first embodiment of the present invention.

FIG. 1 is a block diagram representing the overall arrangement of a synchronous DRAM (hereinafter referred to as an SDRAM according to the first embodiment of the present invention. In FIG. 1, the SDRAM includes a clock buffer 1, a control signal buffer 2, a control signal latch circuit 3, an address buffer 4, an address latch circuit 5, a command decoder 6, a memory array 7, a row select circuit 8, a column select circuit 9, an input buffer 10, an output buffer 11, a determination circuit 12, and an output buffer 13.

Clock buffer 1 is rendered active in response to a signal CKE attaining a logic high or "H" level or the active level and transmits an external clock signal CLK to control signal latch circuit 3, address latch circuit 5, and so on. Control signal buffer 2 and control signal latch circuit 3 transmit external control signals /CS, /RAS, /CAS, /WE, DQM to command decoder 6 in synchronization with external clock signal CLK from clock buffer 1. Address buffer 4 and address latch circuit 5 transmit external address signals A0 to Am (m is an integer greater than or equal to 0) to row select circuit 8 and column select circuit 9 in synchronization with external clock signal CLK from clock buffer 1. Command decoder 6 generates a variety of internal control signals according to external control signals /CS, /RAS, /CAS, /WE, DQM from control signal latch circuit 3 and controls the entire SDRAM.

Figure 2:
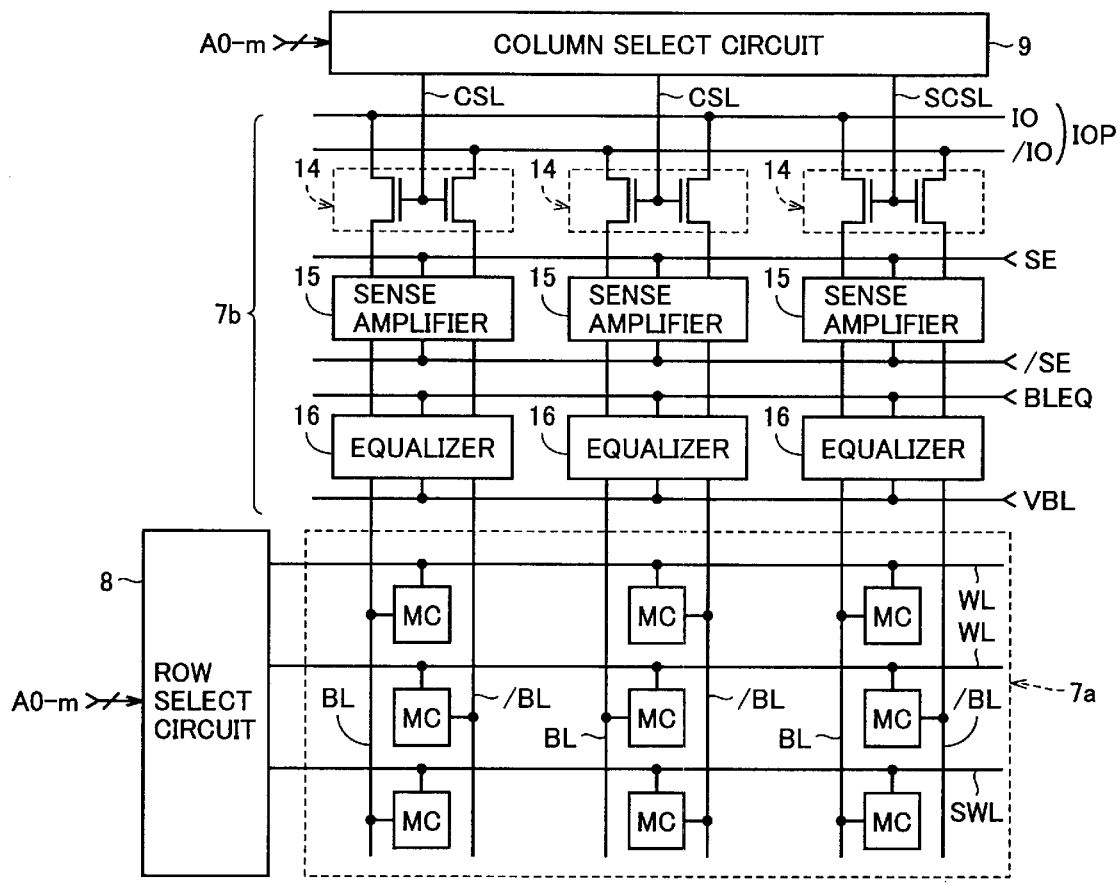
FIG. 2 is a circuit block diagram representing an arrangement of a memory array shown in FIG. 1.

As shown in FIG. 2, memory array 7 includes a memory block 7a and a sense amplifier+input/output control circuit 7b. Memory block 7a includes a plurality of memory cells MC arranged in multiple rows and multiple columns (in FIG. 2, three rows and three columns are shown to simplify the diagram), a prescribed number of word lines WL respectively provided corresponding to a prescribed number (two in FIG. 2) of rows, spare word lines SWL provided corresponding to each of the remaining rows, and a plurality of bit line pairs BL, /BL respectively provided corresponding to the multiple columns. Word line WL of the defective row among the prescribed number of rows is replaced by one spare word line SWL. Memory cell MC is of a well known type which includes an accessing transistor and a capacitor for storing information.

Sense amplifier+input/output control circuit 7b includes a data input/output line pair IO, /IO (IOP), a prescribed number of column select lines CSL respectively provided corresponding to a prescribed number (two in the diagram) of columns, spare column select lines SCSL provided corresponding to each of the remaining columns, and a column select gate 14, a sense amplifier 15, and an equalizer 16 which are provided corresponding to each column. Column select line CSL of the defective column among the prescribed number of columns is replaced by one spare column select line SCSL.

Column select gate 14 includes a pair of N-channel MOS transistors connected between a bit line pair BL, /BL of a corresponding column and a data input/output line pair IO, /IO. A gate of an N-channel MOS transistor is connected to a column select circuit 9 via a column select line CSL of a corresponding column or via a spare column select line SCSL. When column select line CSL or spare column select line SCSL is raised to the select level or the "H" level by column select circuit 9, the N-channel MOS transistors are rendered conductive, and bit line pair BL, /BL is coupled to data input/output line pair IO, /IO.

Sense amplifier 15 amplifies the small potential difference between bit line pair BL, /BL to a power-supply voltage VCC in response to sense amplifier activating signals SE, /SE respectively attaining the "H" level and the logic low or "L" level. Equalizer 16 equalizes the potentials of bit lines BL, /BL in response to a bit line equalize signal BLEQ attaining the active level or the "H" level. Memory array 7 is provided with multiple sets of such memory block 7a and sense amplifier+input/output control circuit 7b.

Row select circuit 8 selects one of a plurality of word lines WL, SWL belonging to each memory block 7a and raises the selected word line to the select level or the "H" level according to a row address signal that corresponds to external address signals A0 to Am input at the time an external control signal /RAS falls to the active level or the "L" level. Column select circuit 9 selects one of the plurality of column select lines CSL, SCSL corresponding to each memory block 7a and raises the selected column select line to the select level or the "H" level according to a column address signal that corresponds to external address signals A0 to Am input at the time an external control signal /CAS falls to the active level or the "L" level.

The other end of data input/output line pair IOP is connected to an input buffer 10 and an output buffer 11, as shown in FIG. 1. Input buffer 10 provides externally supplied data Dn (n is an integer greater than or equal to 0) to a selected memory cell MC via data input/output line pair IOP during a write mode. Output buffer 11 outputs to the outside read data Qn from the selected memory cell MC during a read mode. Determination circuit 12 and output buffer 13 will be described later in detail.

Now, an operation of the SDRAM shown in FIGS. 1 and 2 will be described. During a write mode, column select circuit 9 causes a column select line CSL or SCSL of the column corresponding to a column address signal to rise to the select level or the "H" level, and column select gate 14 of that column is rendered conductive.

Input buffer 10 provides externally supplied write data Dn to a bit line pair BL, /BL of the selected column via data input/output line pair IO, /IO in synchronization with an external clock signal CLK from clock buffer 1. Write data Dn is supplied as a potential difference between the bit lines BL, /BL. Then, row select circuit 8 causes a word line WL or SWL of the row corresponding to the row address signal to rise to the select level or the "H" level, and the transistor of each memory cell MC of that row is rendered conductive. The capacitor of the selected memory cell MC accumulates electric charges in the amount corresponding to the potential of bit line BL or /BL.

In a read mode, first, bit line equalize signal BLEQ falls to the "L" level and equalizer 16 is rendered inactive, thereby stopping the equalizing operation of bit lines BL, /BL. Thereafter, row select circuit 8 causes the word line WL or SWL of the row corresponding to the row address signal to the select level or the "H" level. Accordingly, the potentials of bit lines BL, /BL change by a small amount according to the amount of charge in the capacitor of the active memory cell MC.

Then, sense amplifier activating signals SE, /SE respectively attain the "L" level and the H" level, and sense amplifier 15 is rendered active. When the potential of bit line BL is slightly higher than the potential of bit line /BL, the potential of bit line BL is pulled up to the "H" level, while the potential of bit line /BL is pulled down to the "L" level. Conversely, when the potential of bit line /BL is slightly higher than the potential of bit line BL, the potential of bit line /BL is pulled up to the "H" level while the potential of bit line BL is pulled down to the "L" level.

Then, column select circuit 9 causes a column select line CSL or SCSL of the column corresponding to the column address signal to rise to the select level or the "H" level, and the select gate of that column is rendered conductive. Data of bit line pair BL, /BL of the selected column is supplied to output buffer 11 via column select gate 14 and data input/output line pair IO, /IO. Output buffer 11 outputs read data Qn to the outside in synchronization with external clock signal CLK from clock buffer 1.

Figure 3:
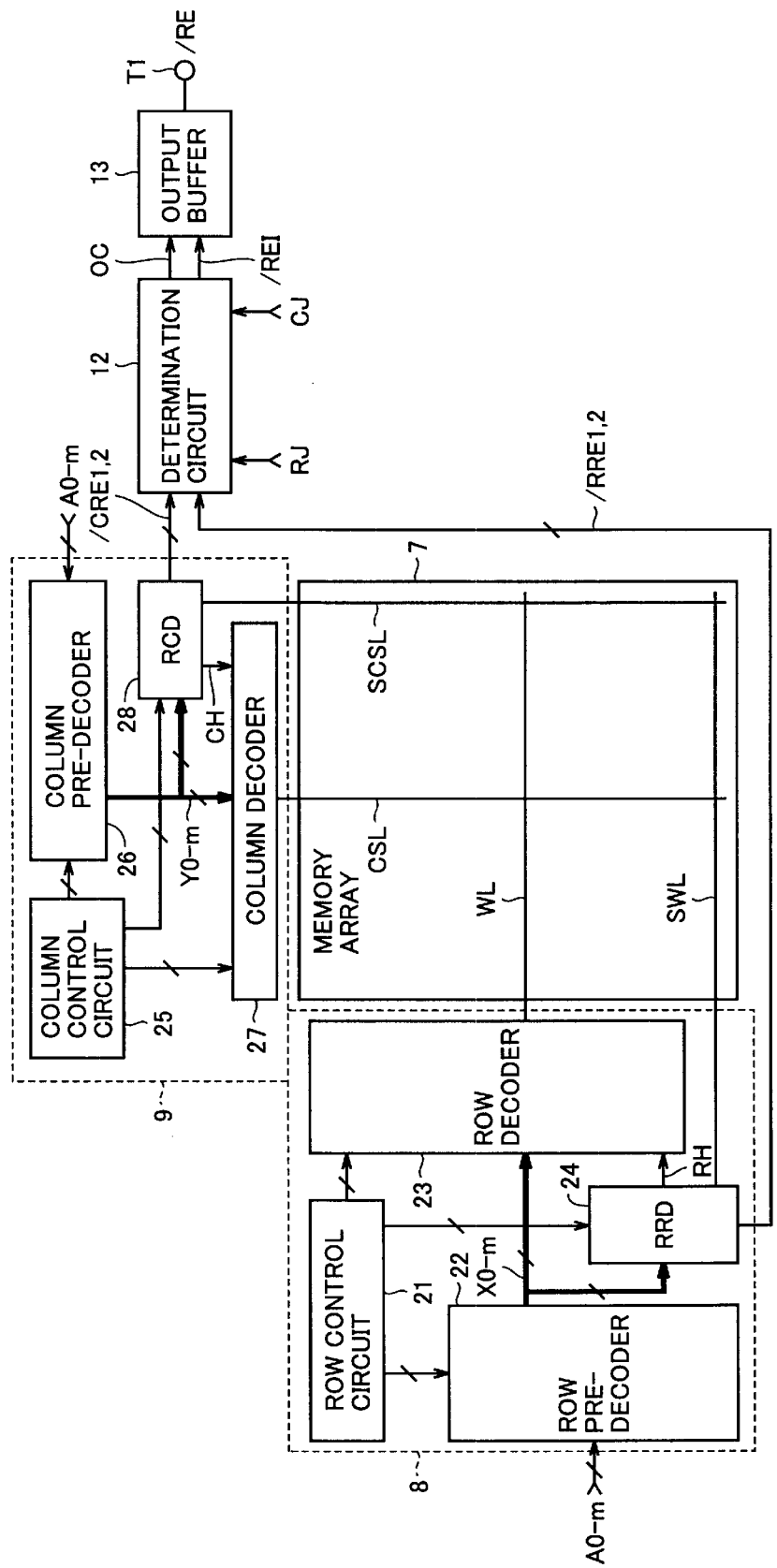
FIG. 3 is a block diagram representing the arrangement of a row select circuit and a column select circuit shown in FIG. 1.

The spare enable determination mode which characterizes the SDRAM of the first embodiment will be described in detail below. FIG. 3 is a block diagram representing the arrangement of row select circuit 8 and column select circuit 9. For simplicity of the drawing and the description, it is assumed that memory array 7 only includes one set of memory block 7a and sense amplifier+input/output control circuit 7b, and that memory block 7a is provided with two spare word lines SWL and two spare column select lines SCSL.

In FIG. 3, row select circuit 8 includes a row control circuit 21, a row pre-decoder 22, a row decoder 23, and a redundant row decoder (RRD) 24. Row control circuit 21 controls row pre-decoder 22, row decoder 23, and redundant row decoder 24 according to signals from command decoder 6. Row pre-decoder 22 pre-decodes a row address signal to generate pre-decode signals X0 to Xm, and supplies those pre-decode signals X0 to Xm to row decoder 23 and redundant row decoder 24. Row decoder 23 selects one of a plurality of word lines WL and causes the selected word line WL to attain the select level or the "H" level according to pre-decode signals X0 to Xm from row pre-decoder 22.

When pre-decode signals X0 to Xm from row pre-decoder 22 designate a defective row, redundant row decoder 24 causes a signal RH to attain the active level or the "H" level, thereby rendering row decoder 23 inactive, while at the same time, causes the spare word line SWL having replaced the word line of the defective row in advance to attain the select level or the "H" level. Moreover, redundant row decoder 24 supplies to determination circuit 12 signals /RRE1, /RRE2 each indicating whether a corresponding one of spare word lines SWL, SWL can replace a word line WL.

Figure 4:
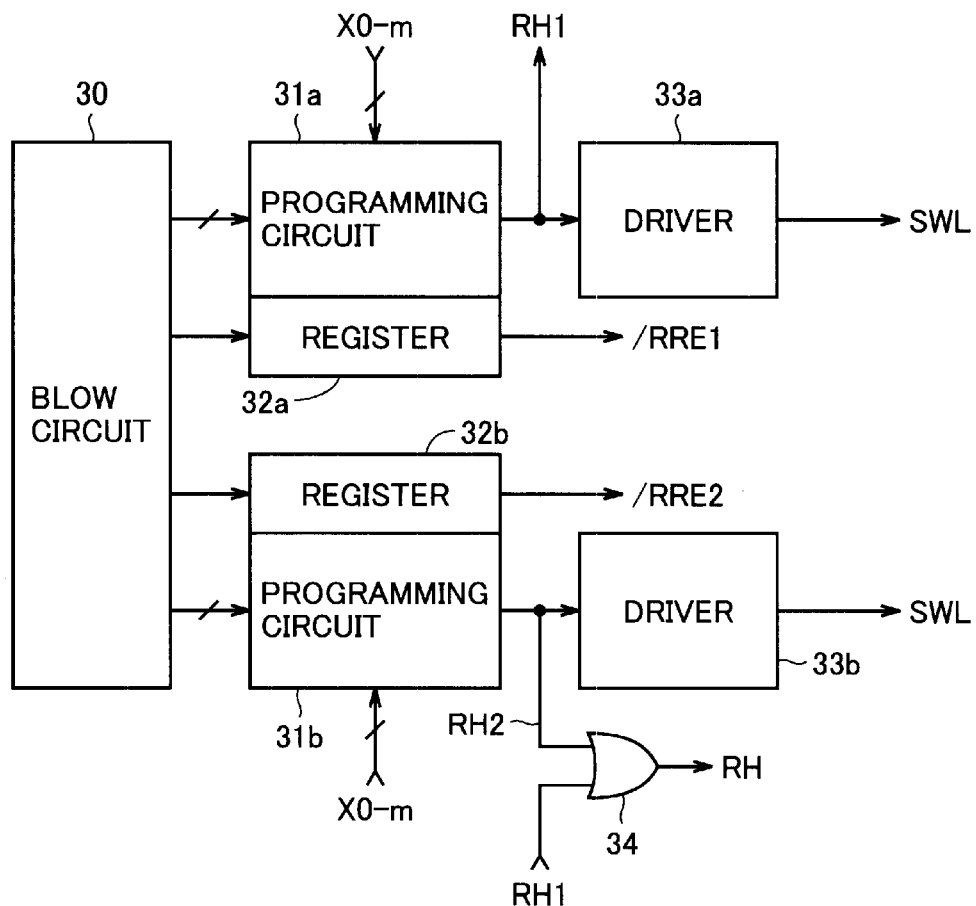
FIG. 4 is a circuit block diagram representing an arrangement of a redundant row decoder shown in FIG. 3.

Thus, redundant row decoder 24 includes a blow circuit 30, programming circuits 31a, 31b, registers 32a, 32b, drivers 33a, 33b, and an OR gate 34, as shown in FIG. 4. Blow circuit 30 is controlled by a signal from row control circuit 21 to blow a plurality of fuses included in each of programming circuits 31a, 31b so that each of programming circuits 31a, 31b stores pre-decode signals X0 to Xm corresponding to a defective row. In addition, blow circuit 30 is controlled by a signal from row control circuit 21 to blow the fuse contained in each of registers 32a, 32b so as to store the fact that a corresponding spare word line SWL has already replaced a word line WL.

Figure 5:
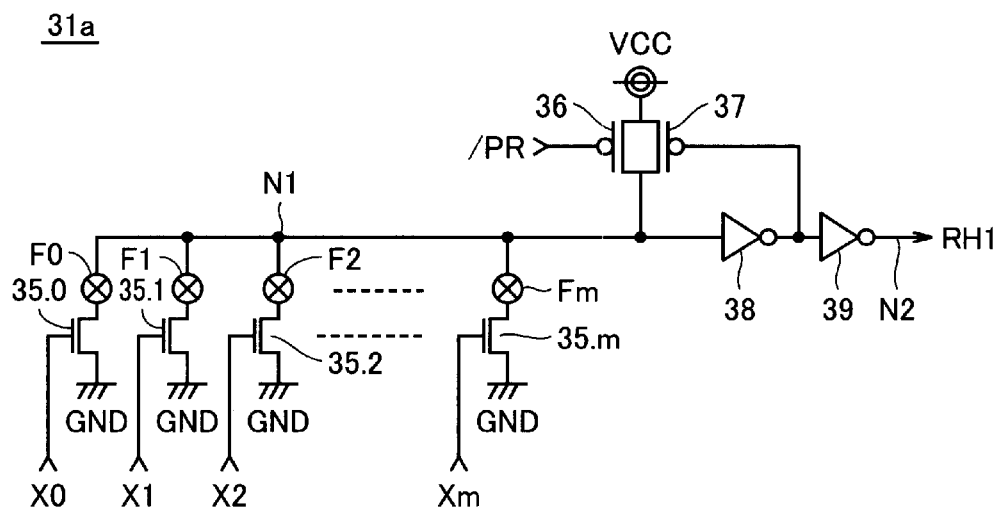
FIG. 5 is a circuit diagram representing an arrangement of a programming circuit shown in FIG. 4.

As shown in FIG. 5, programming circuit 31a includes fuses F0 to Fm, N-channel MOS transistors 35.0 to 35.m, P-channel MOS transistors 36, 37 and inverters 38, 39. One end of each of fuses F0 to Fm is connected to a node N1. N-channel MOS transistors 35.0 to 35.m are respectively connected between the other ends of fuses F0 to Fm and lines of a ground potential GND, and their gates respectively receive pre-decode signals X0 to Xm. Inverters 38, 39 are connected in series between node N1 and an output node N2. A signal that emerges on node N2 becomes an output signal RH1 of programming circuit 31a. P-channel MOS transistor 36 is connected between a line of a power-supply potential VCC and node N1, and its gate receives a precharge signal /PR. P-channel MOS transistor 37 is connected between the line of power-supply potential VCC and node N1, and its gate receives an output signal from inverter 38.

Fuses F0 to Fm are blown when pre-decode signals X0 to Xm corresponding to the respective defective rows are at the "H" level. During a row select operation, first, pre-charge signal /PR attains the "L" level for a certain time period, and node N1 is charged to the "H" level and signal RH1 attains the "H" level. In addition, the output signal from inverter 38 attains the "L" level, which renders P-channel MOS transistor 37 conductive, and node N1 is held at the "H" level. Then, pre-decode signals X0 to Xm are input. When the input pre-decode signals X0 to Xm and the programmed pre-decode signals X0 to Xm do not match, a current flows out on a line of a ground potential GND from node N1 via at least one of N-channel MOS transistors 35.0 to 35.m, and node N1 attains the "L" level so that signal RH1 attains the "L" level. Moreover, when the input pre-decode signals X0 to Xm and the programmed pre-decode signals X0 to Xm do match, a current does not flow out from node N1 to the line of ground potential GND so that node N1 and signal RH1 remain unchanged at the "H" level. Programming circuit 31b has the same arrangement as programming circuit 31a.

Returning to FIG. 4, driver 33a raises a corresponding spare word line SWL from the "L" level to the "H" level when output signal RH1 from programming circuit 31a remains unchanged at the "H" level after pre-decode signals X0 to Xm are input. Driver 33b raises a corresponding spare word line SWL from the "L" level to the "H" level when an output signal RH2 from programming circuit 31b remains unchanged at the "H" level after pre-decode signals X0 to Xm are input. OR gate 34 receives signals RH1, RH2 and outputs a signal RH. When signal RH remains unchanged at the "H" level even after pre-decode signals X0 to Xm are input, row decoder 23 is rendered inactive, and each word line WL is fixed at the "L" level.

Figure 6:
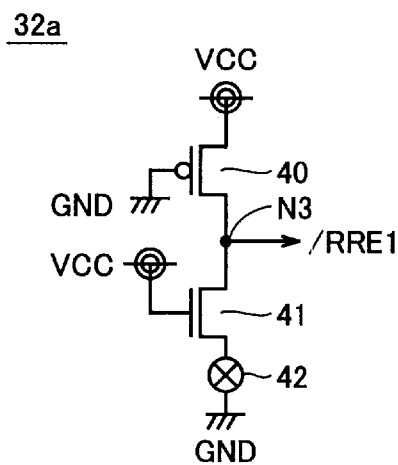
FIG. 6 is a circuit diagram representing an arrangement of a register shown in FIG. 4.

Register 32a includes a P-channel MOS transistor 40, an N-channel MOS transistor 41, and a fuse 42 connected in series between a line of a power-supply potential VCC and a line of a ground potential GND, as shown in FIG. 6. The gates of MOS transistors 40, 41 respectively receive a ground potential GND and a power-supply potential VCC. Each of MOS transistors 40, 41 forms a resistance element. The current drivability of P-channel MOS transistor 40 is set to be smaller than the current drivability of N-channel MOS transistor 41. A signal that emerges on a node N3 between MOS transistors 40, 41 becomes an output signal /RRE1 of register 32a.

Fuse 42 is blown when fuses F0 to Fm are blown. When fuse 42 is not blown, the current flowing out from node N3 becomes greater than the current flowing into node N3 so that signal /RRE1 attains the "L" level. When fuse 42 is blown, a current no longer flows out from node N3 so that signal /RRE1 attains the "H" level. Register 32b has the same arrangement as register 32a. Output signal /RRE1, /RRE2 of registers 32a, 32b are supplied to determination circuit 12.

Returning to FIG. 3, column select circuit 9 includes a column control circuit 25, a column pre-decoder 26, a column decoder 27, and a redundant column decoder (RCD) 28. Column control circuit 25 controls column pre-decoder 26, column decoder 27, and redundant column decoder 28 according to signals from command decoder 6. Column pre-decoder 26 pre-decodes a column address signal to generate pre-decode signals Y0 to Ym, and supplies these pre-decode signals Y0 to Ym to column decoder 27 and redundant column decoder 28. Column decoder 27 selects one of a plurality of column select lines CSL and causes the selected column select line CSL to attain the select level or the "H" level according to pre-decode signals Y0 to Ym from column pre-decoder 26.

When pre-decode signals Y0 to Ym from column pre-decoder 26 designate a defective column, redundant column decoder 28 causes a signal CH to attain the active level or the "H" level, thereby rendering column decoder 27 inactive, while at the same time, causes the spare column select line SCSL having replaced the column select line CSL of the defective column in advance to attain the select level or the "H" level. In addition, redundant column decoder 28 supplies to determination circuit 12 signals /CRE1, /CRE2 each indicating whether a corresponding one of spare column lines SCSL, SCSL can replace a column select line CSL.

Figure 7:
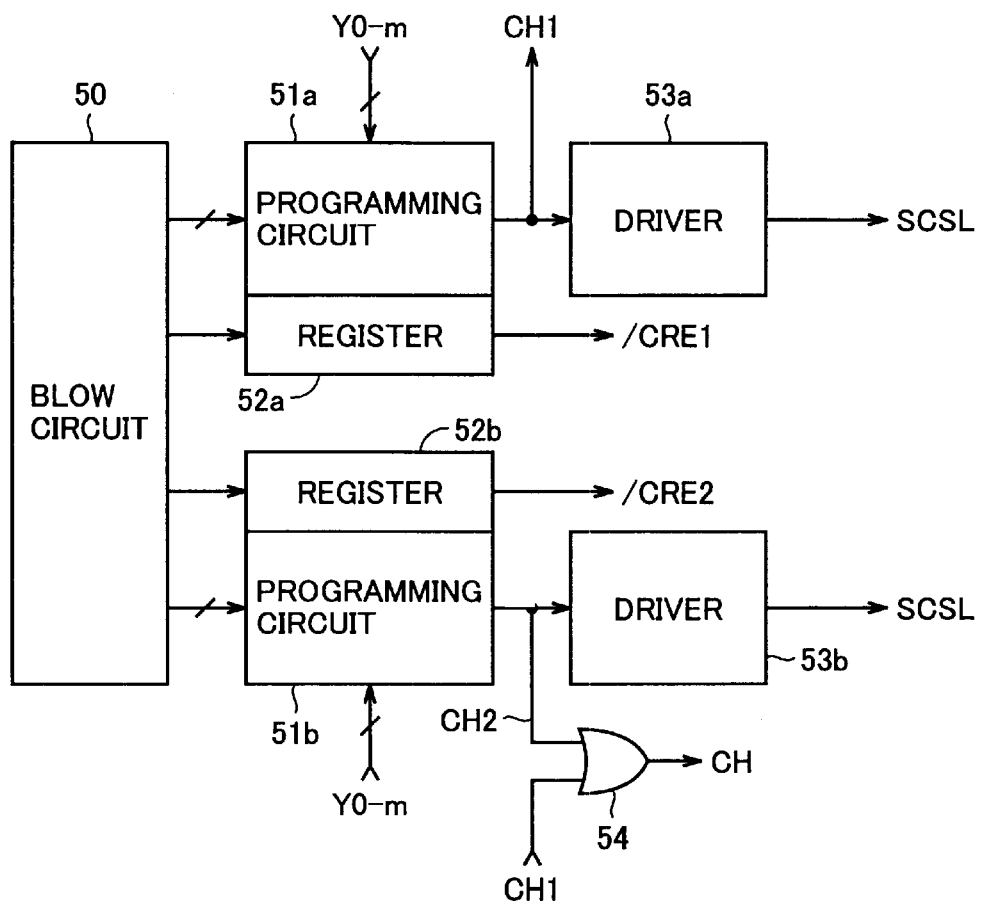
FIG. 7 is a circuit block diagram representing an arrangement of a redundant column decoder shown in FIG. 3.

Thus, redundant column decoder 28 includes a blow circuit 50, programming circuits 51a, 51b, registers 52a, 52b, drivers 53a, 53b, and an OR gate 54, as shown in FIG. 7. Blow circuit 50 is controlled by a signal from column control circuit 25 to blow a plurality of fuses included in each of programming circuits 51a, 51b so that each of programming circuits 51a, 51b stores pre-decode signals Y0 to Ym corresponding to a defective column. In addition, blow circuit 50 is controlled by a signal from column control circuit 25 to blow the fuse included in each of registers 52a, 52b so as to store the fact that a corresponding spare column select line SCSL has already replaced a column select line CSL. The arrangement of programming circuits 51a, 51b is the same as that of programming circuit 31a shown in FIG. 5. Moreover, the arrangement of registers 52a, 52b is the same as that of register 32a shown in FIG. 6.

Driver 53a raises a corresponding spare column select line SCSL from the "L" level to the "H" level when an output signal CH1 from programming circuit 51a remains unchanged at the "H" level after pre-decode signals Y0 to Ym are input. Driver 53b raises a corresponding spare column select line SCSL from the "L" level to the "H" level when an output signal CH2 from programming circuit 51b remains unchanged at the "H" level after pre-decode signals Y0 to Ym are input. OR gate 54 receives signals CH1, CH2 and outputs a signal CH. When signal CH remains unchanged at the "H" level even after pre-decode signals Y0 to Ym are input, column decoder 27 is rendered inactive, and each column select line CSL is fixed at the "L" level. Output signals /CRE1, /CRE2 of registers 52a, 52b are supplied to determination circuit 12.

As shown in FIG. 8, determination circuit 12 includes AND gates 55 to 58 and OR gates 59, 60. AND gate 55 receives output signals /RRE1, /RRE2 of registers 32a, 32b. AND gate 56 receives output signals /CRE1, /CRE2 of registers 52a, 52b. AND gate 57 receives an output signal φ55 of AND gate 55 and a signal RJ from command decoder 6. Signal RJ is a signal that attains the "H" level in a row repair enable determination mode in which it is determined whether there is a spare word line SWL that can replace a word line WL. AND gate 58 receives an output signal φ56 of AND gate 56 and a signal CJ from command decoder 6. Signal CJ is a signal that attains the "H" level in a column repair enable determination mode in which it is determined whether there is a spare column select line SCSL that. can replace a column select line CSL. OR gate 59 receives output signals φ57, φ58 of AND gates 57, 58 and outputs a signal /REI. OR gate 60 receives signals RJ, CJ and outputs a signal OC.

In the row repair enable determination mode, signals RJ, CJ respectively attain the "H" level and the "L" level. When at least one of two spare word lines SWL is unused, at least one of signals /RRE1, /RRE2 attains the "L" level, and output signal φ55 from AND gate 55 attains the "L" level. When both two spare word lines SVL are being used, signals /RRE1, /RRE2 both attain the "H" level, and output signal φ55 from AND gate 55 attains the "H" level. Since signals RJ, CJ are respectively at the "H" level and the "L" level, output signal φ55 of AND gate 55 passes through AND gate 57 and OR gate 59 and becomes signal /REI. In addition, output signal OC attains the "H" level.

Moreover, during the column repair enable determination mode, signals RJ, CJ respectively attain the "L" level and the "H" level. When at least one of two spare column select lines SCSL is unused, at least one of signals /CRE1, /CRE2 attains the "L" level, and output signal φ56 from AND gate 56 attains the "L" level. When both two spare column select lines SCSL are being used, both signals /CRE1, /CRE2 attain the "H" level, and output signal φ56 from AND gate 56 attains the "H" level. Since signals RJ, CJ respectively are at the "L" level and the "H" level, output signal φ56 of AND gate 56 passes through AND gate 58 and OR gate 59 and becomes signal /REI. In addition, output signal OC attains the "H" level.

Further, during a normal operation, signals RJ, CJ both attain the "L" level so that signals OC, /REI both attain the "L" level. Signals OC, /REI are supplied to output buffer 13. Returning to FIG. 3, output buffer 13 supplies to an output terminal T1 a signal /RE of the same level as signal /REI when signal OC is at the "H" level, and causes output terminal T1 to attain a high impedance state when signal OC is at the "L" level.

FIGS. 9A to 9F are timing charts representing a row repair enable determination mode of the SDRAM shown in FIGS. 1 to 8. When a row repair enable determination command ROWRE is input by external control signals /RAS, /CAS, and so on, the command ROWRE is supplied to command decoder 6 in response to the rising edge of external clock signal CLK. When command decoder 6 causes signal RJ to rise to the active level or the "H" level, output signal φ57 from AND gate 57 in FIG. 8 attains the "L" level or the "H" level, and output buffer 13 outputs signal /RE of the same level as signal /REI to output terminal T1. It is impossible to replace word line WL of the defective row with a spare word line SWL when signal /RE is at the "H" level, whereas the replacement is possible when signal /RE is at the "L" level. When signal /RE is at the "L" level, address signals A0 to Am designating the defective row and a row repair execution command are input to the SDRAM to cause blow circuit 30 to execute blowing of fuses so that pre-decode signals X0 to Xm corresponding to the defective row are stored in programming circuit 31a or programming circuit 31b. The operation in the column repair enable determination mode is performed in a similar manner to the operation in the row repair enable determination mode.

Therefore, according to the SDRAM of the first embodiment, in the state of a finished product where packaging has been completed, it can be determined whether it is possible to replace a word line WL (and/or a column select line CSL) of a defective row (and/or column) with a spare word line SWL (and/or a spare column select line SCSL), and when the replacement is determined to be possible, the word line WL (and/or column select line CSL) of the defective row (and/or column) can be replaced by a spare word line SWL (and/or a spare column select line SCSL).

Second Embodiment

Figure 10:
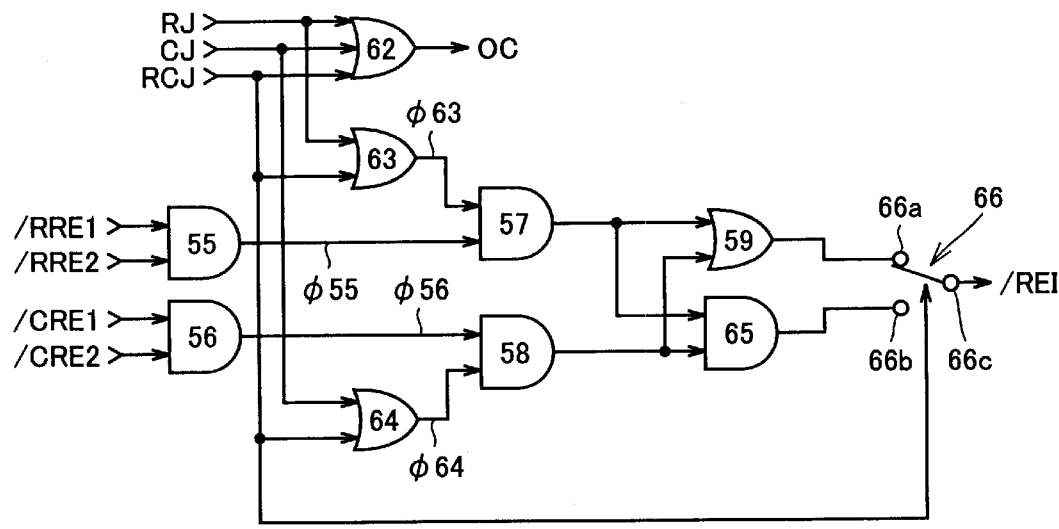
FIG. 10 is a circuit diagram representing an arrangement of a determination circuit of an SDRAM according to a second embodiment of the present invention.

FIG. 10 is a circuit diagram representing the main portion of an SDRAM according to the second embodiment of the present invention. As shown in FIG. 10, this SDRAM differs from the SDRAM according to the first embodiment in that determination circuit 12 is replaced by a determination circuit 61 and that a signal RCJ is introduced. Signal RCJ is a signal that attains the "H" level in a repair enable determination mode in which it is determined whether it is possible to replace a defective memory cell MC with a spare memory cell MC regardless of whether the replacement is done with a spare word line SWL or with a spare column select line SCSL. Command decoder 6 causes signal RCJ to attain the active level or the "H" level in response to a repair enable determination command being input.

Determination circuit 61 has an OR gate 62 replacing OR gate 60 in determination circuit 12 shown in FIG. 8 and has OR gates 63, 64, an AND gate 65, and a switch 66 additionally provided. OR gate 62 receives signals RJ, CJ, RCJ, and outputs a signal OC. OR gate 63 receives signals RJ, RCJ, and its output signal φ63 is supplied to an AND gate 57 in place of signal RJ. OR gate 64 receives signals CJ, RCJ, and its output signal φ64 is supplied to an AND gate 58 in place of signal CJ.

An output signal of OR gate 59 is input to one switching terminal 66a of switch 66. AND gate 65 receives output signals from AND gates 57, 58, and an output signal of AND gate 65 is input to the other switching terminal 66b of switch 66. When signal RCJ is at the "L" level, conduction is established between one switching terminal 66a and a common terminal 66c of switch 66. When signal RCJ is at the "H" level, conduction is established between the other switching terminal 66b and common terminal 66c of switch 66. A signal that emerges on common terminal 66c becomes an output signal /REI of determination circuit 61.

During the repair enable determination mode, signal RCJ attains the "H" level, and signals RJ, CJ both attain the "L" level. Consequently, output signals OC, φ63, φ64 from OR gates 62, 63, 64 all attain the "H" level, while at the same time, conduction is established between terminals 66b, 66c of switch 66, and output signals φ55, φ56 of AND gates 55, 56 pass through AND gates 57, 58 to be input to OR gate 59 and AND gate 65, and an output signal from AND gate 65 passes through switch 66 and becomes signal /REI. Thus, when at least one of signals /RRE1, /RRE2, /CRE1, and /CRE2 is at the "L" level, signal /REI attains the "L" level so that it can be determined that at least one among two spare word lines SWL and two spare column select lines SCSL is still unused and that the repair can be performed. In addition, when all the signals /RRE1, /RRE2, /CRE1, and /CRE2 are at the "H" level, signal /REI attains the "H" level so that it is determined that the two spare word lines SWL and the two spare column select lines SCSL are already being used and that the repair is impossible.

During the row repair enable determination mode or the column repair enable determination mode, signal RJ or signal CJ attains the "H" level, while at the same time, signal CJ or signal RJ and signal RCJ attain the "L" level so that signals RJ, CJ pass through OR gates 63, 64 to be input to AND gates 57, 58, while conduction is established between terminals 66a, 66c of switch 66. Thus, in this case, determination circuit 61 would have the same arrangement as determination circuit 12 of FIG. 8.

Third Embodiment

Figure 11:
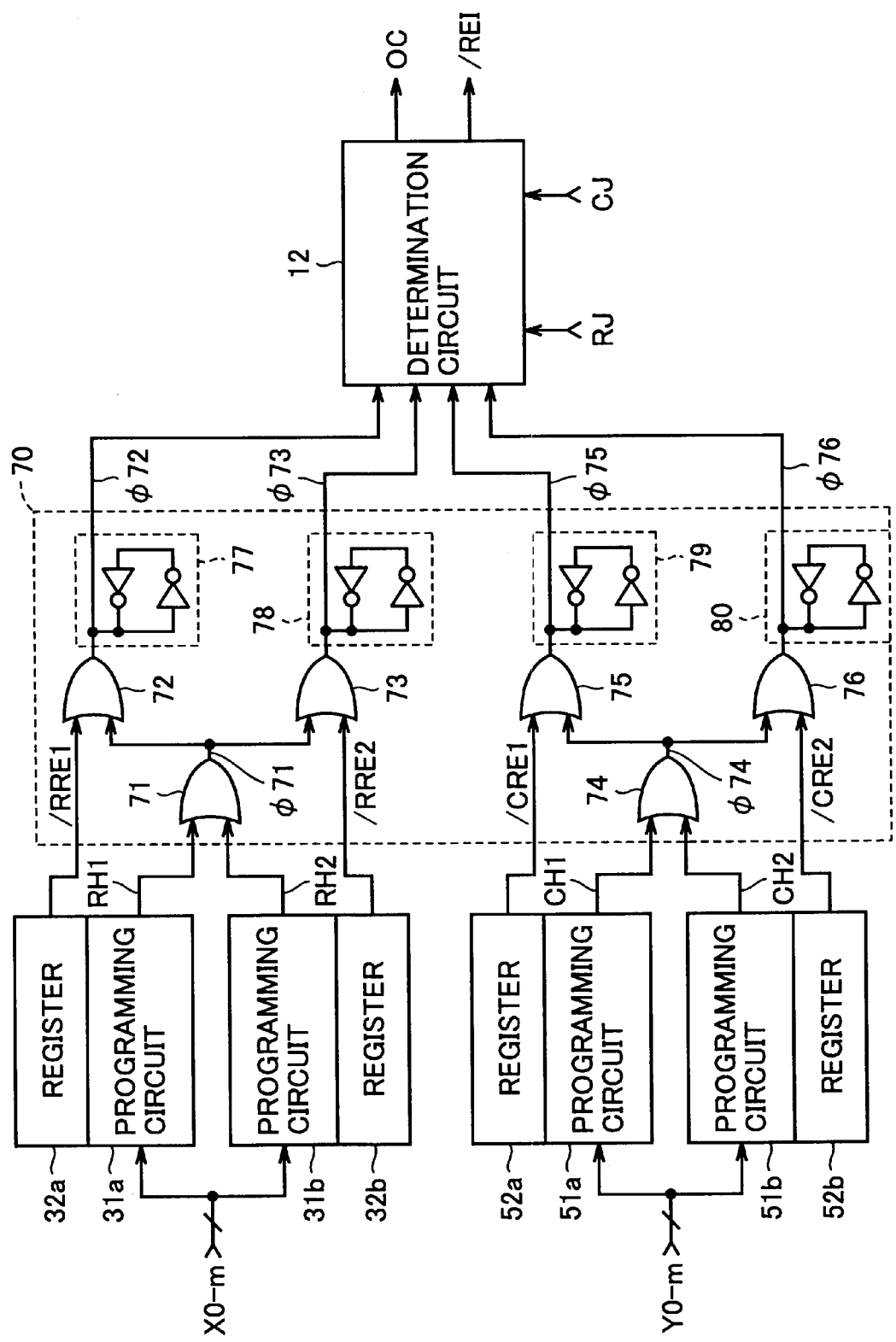
FIG. 11 is a circuit block diagram representing a main portion of a determination circuit of an SDRAM according to a third embodiment of the present invention.
Figure 12:
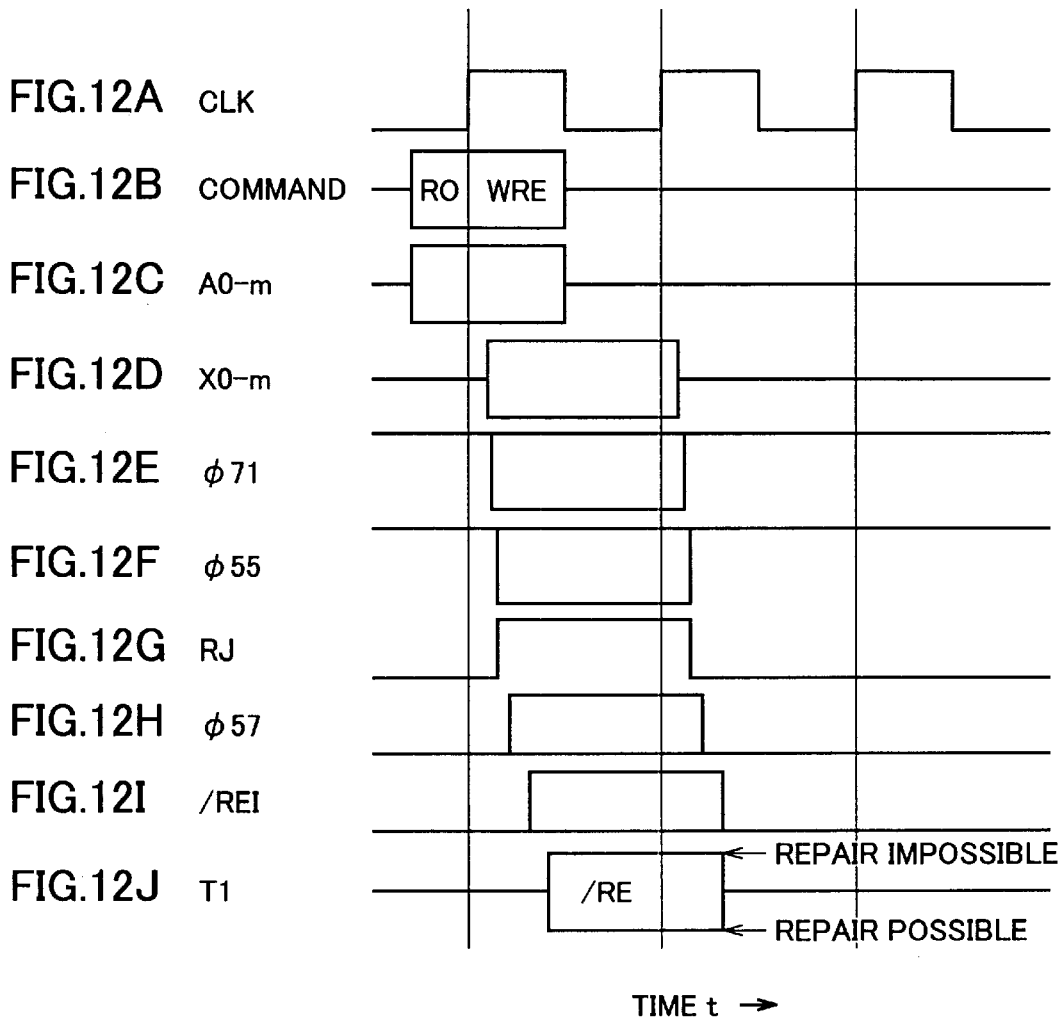
FIGS. 12A to 12J are timing charts showing the operation during a row repair enable determination mode of the SDRAM described with reference to FIG. 11.

FIG. 11 is a circuit block diagram representing the main portion of an SDRAM according to the third embodiment of the present invention. As shown in FIG. 11, this SDRAM differs from the SDRAM of the first embodiment in that an overlap repair prevention circuit 70 is provided between determination circuit 12 and redundant row decoder 24 and a redundant column decoder 28.

Overlap repair prevention circuit 70 includes OR gates 71 to 76 and latch circuits 77 to 80. OR gate 71 receives output signals RH1, RH2 from programming circuits 31a, 31b of redundant row decoder 24. OR gate 72 receives an output signal /RRE1 from register 32a and an output signal φ71 from OR gate 71. OR gate 73 receives an output signal /RRE2 from register 32b and output signal φ71 from OR gate 71. Output signals φ71, φ73 from OR gates 72, 73 are supplied to determination circuit 12 in place of signals /RRE1, /RRE2.

OR gate 74 receives output signals CH1, CH2 from programming circuits 51a, 51b of redundant column decoder 28. OR gate 75 receives an output signal /CRE1 from register 52a and an output signal φ74 from OR gate 74. OR gate 76 receives an output signal /CRE2 from register 52b and output signal φ74 from OR gate 74. Output signals φ75, φ76 from OR gates 75, 76 are supplied to determination circuit 12 in place of signals /CRE1, /CRE2. Each of latch circuits 77 to 80 includes two inverters connected in reverse-parallel. Latch circuits 77 to 80 respectively latch the level of output signals φ72, φ73, φ75, φ76 from OR gates 72, 73, 75, 76.

FIGS. 12A to 12J are timing charts representing the row repair enable determination mode of the SDRAM described with reference to FIG. 11. When row repair enable determination command ROWRE is input by external control signals /RAS, /CAS, and so on, this command ROWRE is supplied to command decoder 6 in response to the rising edge of external clock signal CLK, and command decoder 6 causes signal RJ to rise to the "H" level. In addition, external address signals A0 to Am corresponding to a word line WL of a defective row to be replaced with a spare word line SWL are input at the same time as inputting of command ROWRE, and pre-decode signals X0 to Xm are generated in response to these external address signals A0 to Am. These pre-decode signals X0 to Xm are supplied to programming circuits 31a, 31b.

When pre-decode signals X0 to Xm supplied to programming circuits 31a, 31b designate word line WL of the defective row already replaced by a spare word line SWL, output signal RH1 from programming circuit 31a or output signal RH2 from programming circuit 31b remains unchanged at the "H" level even after pre-decode signals X0 to Xm are input, so that output signal φ71 from OR gate 71 attains the "H" level. When output signal φ71 of OR gate 71 attains the "H" level, output signals φ72, φ73 of OR gates 72, 73 both attain the "H" level regardless of output signals /RRE1, /RRE2 from registers 32a, 32b, and an output signal φ55 from AND gate 55 of determination circuit 12 shown in FIG. 8 attains the "H" level. Since signals RJ, CJ respectively are at the "H" level and the "L" level, output signal φ55 from AND gate 55 passes through AND gate 57 and OR gate 59 and becomes signal /REI. Moreover, signal OC attains the "H" level, and signal /RE of the same level as signal /REI is output to output terminal T1. Thus, signal /RE attains the same level of "H" as signal φ55 so that it is determined that the repair is impossible.

On the other hand, when pre-decode signals X0 to Xm supplied to programming circuits 31a, 31b designate a word line WL of a row not yet replaced by a spare word line SWL, output signals RH1, RH2 from programming circuits 31a, 31b both attain the "L" level so that output signal φ71 from OR gate 71 attains the "L" level. In this case, output signals /RRE1, /RRE2 from registers 32a, 32b pass through OR gates 72, 73 and are input directly to determination circuit 12. Thus in this case, it is determined whether the repair is possible or not based on only output signals /RRE1, /RRE2 from registers 32a, 32b and independently of pre-decode signals X0 to Xm as in the first embodiment.

According to the third embodiment, when the word line WL about to be replaced with a spare word line SWL has already been replaced with a spare word line SWL, signal /RE attains the "H" level and it is determined that the repair is impossible. Consequently, the replacement of one word line WL by two spare word lines SWL, and thus, two spare word lines SWL simultaneously attaining the select level of the "H" level, is prevented.

Fourth Embodiment

Figure 13:
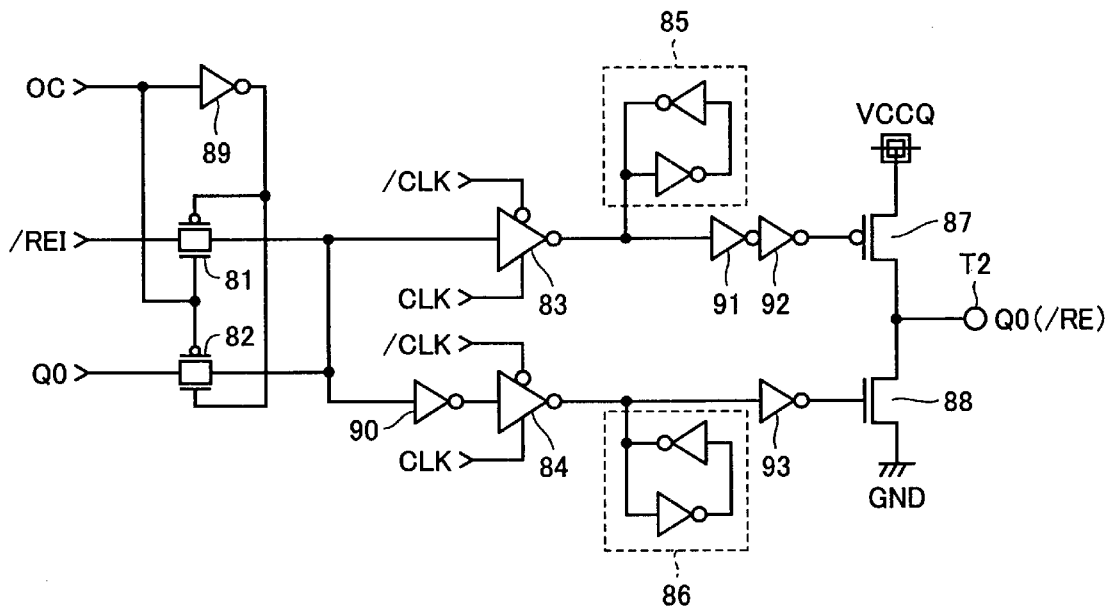
FIG. 13 is a circuit diagram representing a main portion of an SDRAM according to a fourth embodiment of the present invention.

FIG. 13 is a circuit diagram representing the main portion of an SDRAM according to the fourth embodiment of the present invention. As shown in FIG. 13, this SDRAM differs from the SDRAM of the first embodiment in that a data input/output terminal T2 also serves as an output terminal for a signal /RE and that an output buffer for data Q0 also serves as an output buffer for signal /RE.

The output buffer of this SDRAM includes transfer gates 81,82, clocked inverters 83, 84, latch circuits 85, 86, a P-channel MOS transistor 87, an N-channel MOS transistor 88, and inverters 89 to 93. MOS transistors 87, 88 are respectively connected between data input/output terminal T2 and a line of a power-supply potential VCCQ and a line of a ground potential GND. One terminal of transfer gate 81 receives signal /REI, and the other terminal of transfer gate 81 is connected to a gate of P-channel MOS transistor 87 via clocked inverter 83 and inverters 91 92. One terminal of transfer gate 82 receives a read data signal Q0, and the other terminal of transfer gate 82 is connected to the other terminal of transfer gate 81 and to a gate of N-channel MOS transistor 88 via inverter 90, clock inverter 84, and inverter 93.

Each of latch circuits 85, 86 includes two inverters connected in reverse-parallel. Latch circuits 85, 86 respectively latch the level of output signals from clocked inverters 83, 84. Signal OC is directly input to a gate on the N-channel MOS transistor side of transfer gate 81 and to a gate of P-channel MOS transistor of transfer gate 82, while at the same time, is input via inverter 89 to a gate on the P-channel MOS transistor side of transfer gate 81 and to a gate on the N-channel MOS transistor side of transfer gate 82.

During the repair enable determination mode, signal OC attains the active level or the "H" level, and transfer gate 81 is rendered conductive while transfer gate 82 is rendered non-conductive. Consequently, signal /REI is input to a gate of P-channel MOS transistor 87 via transfer gate 81 and inverters 83, 91, 92, and is also input to a gate of N-channel MOS transistor 88 via transfer gate 81 and inverters 90, 84, 93.

When signal /REI is at the active level or the "L" level, P-channel MOS transistor 87 is rendered non-conductive, while at the same time, N-channel MOS transistor 88 is rendered conductive so that data input/output terminal T2 attains the "L" level. When signal /REI is at the inactive level or the "H" level, P-channel MOS transistor 87 is rendered conductive, while at the same time, N-channel MOS transistor 88 is rendered non-conductive so that data input/output terminal T2 attains the "H" level.

During the normal operation, signal OC attains the inactive level or the "L" level, and transfer gate 82 is rendered conductive while transfer gate 81 is rendered non-conductive. When data signal Q0 is at the "L" level, P-channel MOS transistor 87 is rendered non-conductive, while at the same time, N-channel MOS transistor 88 is rendered conductive so that data input/output terminal T2 attains the "L" level. When data signal Q0 is at the "H" level, P-channel MOS transistor 87 is rendered conductive while N-channel MOS transistor 88 is rendered non-conductive, so that data input/output terminal T2 attains the "L" level.

According to the fourth embodiment, the output buffer for data Q0 and data input/output terminal T2 also serve as the output buffer and the output terminal for signal /RE so that less circuit area and less number of terminals are required than in the first embodiment.

Fifth Embodiment

Figure 14:
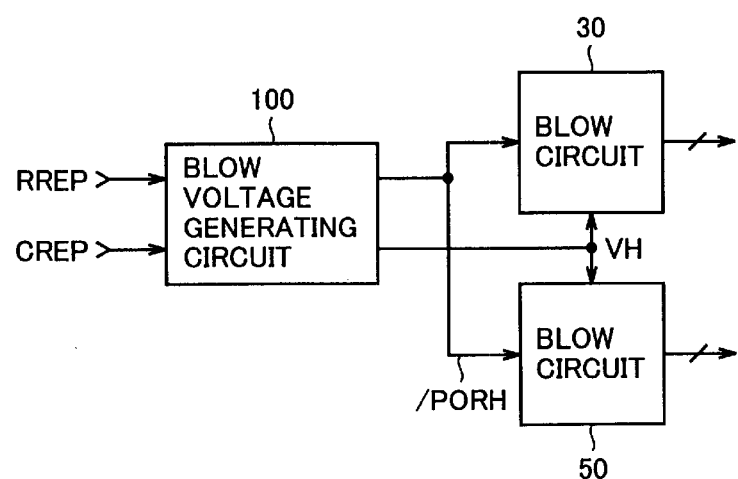
FIG. 14 is a block diagram representing a main portion of an SDRAM according to a fifth embodiment of the present invention.

FIG. 14 is a block diagram representing the main portion of an SDRAM according to the fifth embodiment of the present invention. As shown in FIG. 14, this SDRAM differs from the SDRAM of the first embodiment in that the SDRAM of the fifth embodiment is provided with a blow voltage generating circuit 100 for generating a blow voltage VH for blowing a fuse.

Blow voltage generating circuit 100 generates blow voltage VH and a signal /PORH and supplies the generated blow voltage VH and signal /PORH to the blow circuits 30, 50 in response to signals RREP, CREP from command decoder 6. Command decoder 6 causes signal RREP to attain the active level or the "H" level in response to inputting of a row repair command by external control signals /RAS, /CAS, and so on, and causes signal CREP to attain the active level or the "H" level in response to inputting of a column repair command by external control signals /RAS, /CAS, and so on. Blow circuits 30, 50 supply blow voltage VH to a fuse during the period in which signal /PORH is at the active level or the "L" level so as to blow the fuse.

Figure 15:
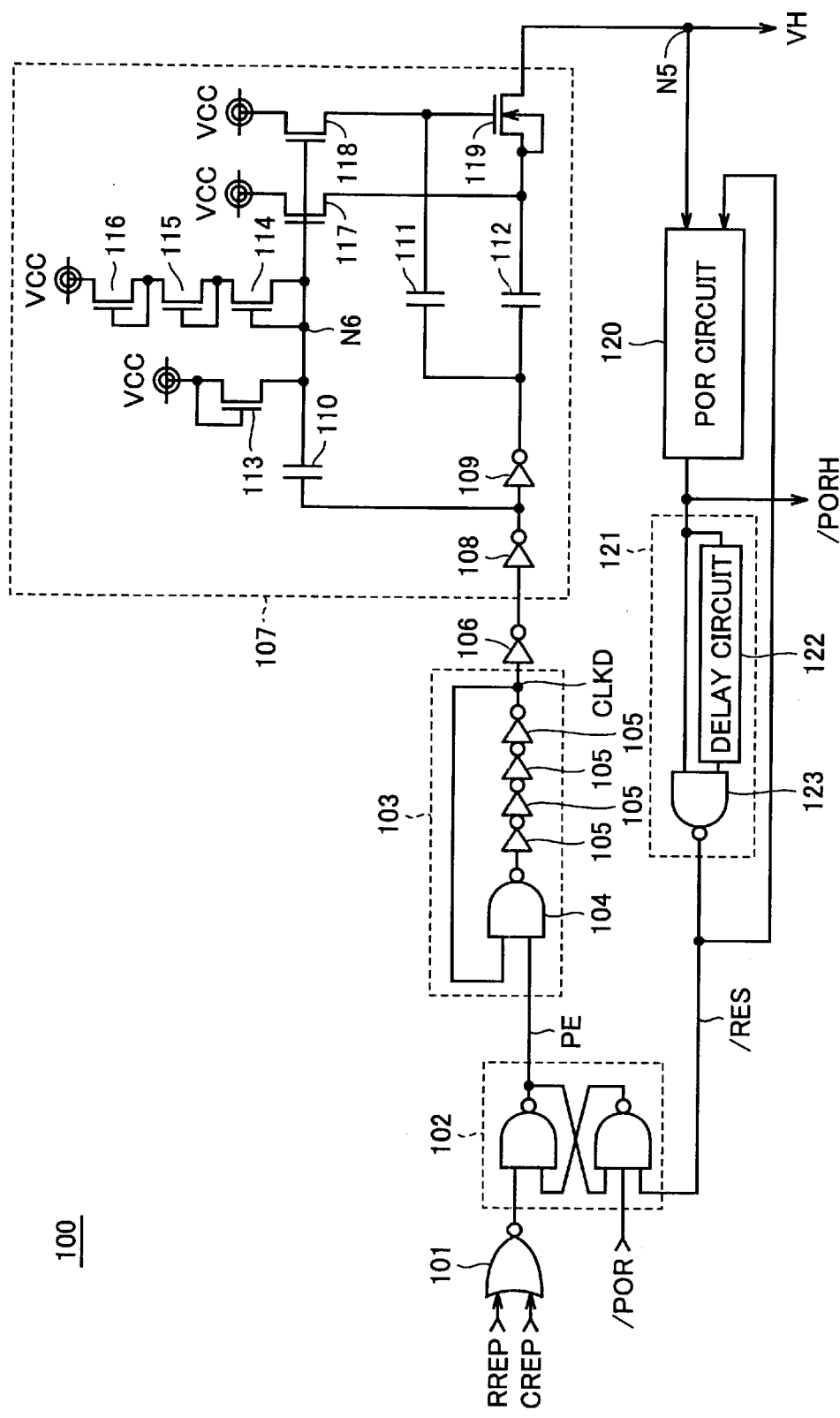
FIG. 15 is a circuit block diagram representing an arrangement of a blow voltage generating circuit shown in FIG. 14.

More specifically, as shown in FIG. 15, blow voltage generating circuit 100 includes an NOR gate 101, a flip-flop 102, a ring oscillator 103, an inverter 106, a charge-pump circuit 107, a POR circuit 120, and a pulse generating circuit 121. NOR gate 101 receives signals RREP, CREP. Flip-flop 102 includes two NAND gates, is set in response to an output signal of NOR gate 101 falling to the "L" level, and is reset in response to signal /POR attaining the "L" level or in response to signal /RES attaining the "L" level. Ring oscillator 103 includes an NAND gate 104 for receiving at one input node an output signal PE from flip-flop 102, and inverters 105 of even number of stages (four stages in the diagram) connected in series between an output node of NAND gate 104 and the other input node of NAND gate 104 When flip-flop 102 is set and signal PE attains the "H" level, ring oscillator 103 is rendered active, and a clock signal CLKD is supplied from ring oscillator 103 via inverter 106 to charge-pump circuit 107.

Charge-pump circuit 107 includes inverters 108, 109, capacitors 110 to 112, and N-channel MOS transistors 113 to 119. Inverters 108, 109, capacitor 112 and N-channel MOS transistor 119 are connected in series between an output node of inverter 106 and a power-supply node N5. N-channel MOS transistors 117, 118 are respectively connected between lines of power-supply potential VCC and a drain and a gate of N-channel MOS transistor 119. Capacitor 111 is connected between an output node of inverter 109 and a gate of N-channel MOS transistor 119. Capacitor 110 is connected between an output node of inverter 108 and the gates (node N6) of N-channel MOS transistors 117, 118. N-channel MOS transistor 113 forms a diode element, and is connected between a line of a power-supply potential VCC and node N6. Each of N-channel MOS transistors 114 to 116 forms a diode element, and N-channel MOS transistors 114 to 116 are connected in series between node N6 and a line of a power-supply potential VCC.

During the period in which clock signal CLKD is at the "L" level, the output node of inverter 108 attains the "L" level and capacitor 110 is charged to VCC−Vth (Vth is a threshold voltage of an N-channel MOS transistor). When clock signal CLKD rises from the "L" level to the "H" level, the output node of inverter 108 rises from the "L" level to the "H" level so that the potential at node N6 rises. When the potential of node N6 exceeds VCC+3Vth, N-channel MOS transistors 114 to 116 are rendered conductive so that the potential of node N6 is held at VCC+3Vth, and N-channel MOS transistors 117, 118 are held in their conductive state.

During the period in which clock signal CLKD is at the "H" level, the output node of inverter 109 attains the "L" level, and capacitors 111, 112 are charged to a power-supply potential VCC. When clock signal CLKD falls from the "H" level to the "L" level, the output node of inverter 109 rises from the "L" level to the "H" level so that the potentials of the drain and the gate of N-channel MOS transistor 119 reach 2VCC, and the charges of capacitor 112 are supplied to power-supply node N5 via N-channel MOS transistor 119. A potential VH of power-supply node N5 rises at every falling edge of clock signal CLKD up to 2VCC−Vth.

POR circuit 120 causes signal /PORH to attain the "L" level while blow voltage VH is between 0 V and a reference potential VR (VR<2VCC−Vth), and causes signal /PORH to attain the "H" level in response to blow voltage VH exceeding reference voltage VR. In addition, POR circuit 120 is reset in response to signal /RES attaining the "L" level, and causes signals /PORH to attain the "L" level.

Pulse generating circuit 121 includes a delay circuit 122 and an NAND gate 123. Signal /PORH is directly input to one input node of NAND gate 123 and is input to the other input node of NAND gate 123 via delay circuit 122. An output signal from NAND gate 123 becomes reset signal /RES.

During the period in which signal /PORH is at the "L" level, output signal /RES from NAND gate 123 attains the "H" level. When signal /PORH rises from the "L" level to the "H" level, output signal /RES of NAND gate 123 falls from the "H" level to the "L" level after the delay time of delay circuit 122. When signal /RES falls to the "L" level, POR circuit 120 is reset and signal /PORH falls to the "L" level, and signal /RES rises to the "H" level.

FIGS. 16A to 16G are timing charts representing an operation in a row repair mode of blow voltage generating circuit 100 shown in FIGS. 14 and 15. When a row repair command RRep is input by external control signals /RAS, /CAS, and so on, command RRep is supplied to command decoder 6 in response to the rising edge of external clock signal CLK, and signal RREP rises to the "H" level in a pulse-like manner. As a result, flip-flop 102 is set and signal PE rises to the "H" level so that ring oscillator 103 is rendered active and clock signal CLKD is generated.

Charges are supplied to power-supply node N5 from charge-pump circuit 107 in response to each falling edge of clock signal CLKD, and voltage VH of power-supply node N5 gradually rises. When voltage VH of power supply node N5 exceeds reference voltage VR, POR circuit 120 causes signal 'PORH to rise from the "L" level to the "H" level. When signal /PORH attains the "H" level, blow circuits 30, 50 start blowing the fuses.

After the delay time of delay circuit 122 from the rising edge of signal /PORH, pulse generating circuit 121 causes signal /RES to fall from the "H" level to the "L" level. Flip-flop 102 and POR circuit 120 are reset in response to the falling edge of signal /RES, and signals PE, /PORH fall to the "L" level. Ring oscillator 103 and charge-pump circuit 107 are rendered inactive in response to the falling edge of signal PE, and signal /RE returns to the "H" level in response to the falling edge of signal /PORH. In a column repair mode, the same operation as the row repair mode is performed except that signal CREP instead of signal RREP rises to the "H" level in a pulse-like manner.

In the fifth embodiment, blow voltage generating circuit 100 is provided within the SDRAM so that there is no need separately to apply blow voltage VH to the SDRAM when the fuses are to be blown. Thus, there is no need for a user to prepare a power source other than the power source for power-supply voltage VCC so that the repair can be performed with ease.

Moreover, although POR circuit 120 and flip-flop 102 are reset with signal /RES in the fifth embodiment, signals indicating the completion of fuse blow may be generated from each of blow circuits 30, 50, and POR circuit 120 and flip-flop 102 may be reset using these signals.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells, each of which is assigned in advance a unique address;
   at least one spare memory cell for replacing defective memory cells among said plurality of memory cells;
   a decoder for selecting one memory cell of said plurality of memory cells according to an externally supplied address signal;
   at least one programming circuit for storing addresses corresponding to defective memory cells and for rendering said decoder inactive and selecting one of the at least one spare memory cell in response to the externally supplied address signal representing one of the addresses stored in the at least one programming circuit;
   a write/read circuit for performing a write/read operation of data signals on a memory cell selected by said decoder or one of the at least one spare memory cell selected by said programming circuit; and
   a first determination circuit for generating an output signal indicating availability to replace a defective memory cell with the at least one spare memory cell.

2. The semiconductor memory device according to claim 1, further comprising:
   a data input/output terminal for communicating a data signal between said write/read circuit and outside; and
   a switching circuit for supplying to said data input/output terminal a data signal read by said write/read circuit in a read mode and for supplying to said data input/output terminal an output signal of said first determination circuit in a determination mode.

3. The semiconductor memory device according to claim 1, wherein the at least one programming circuit includes at least one first fuse; and the semiconductor memory device further comprising a blow circuit for selectively blowing said at least one first fuse to program addresses corresponding to defective memory cells into the at least one programming circuit.

4. The semiconductor memory device according to claim 3, further comprising:
   a blow voltage generating circuit for generating a blow voltage for blowing said at least one first fuse and for applying the generated blow voltage to said at least one first fuse via said blow circuit.

5. The semiconductor memory device according to claim 1, wherein
   said first determination circuit generates the output signal based on whether there is any available programming circuit for storing an address corresponding to an defective memory cell.

6. The semiconductor memory device according to claim 5, wherein each of the at least one programming circuit includes at least one first fuse for programming addresses corresponding to defective memory cells into the at least one programming circuit;
   the semiconductor memory device further comprising:
   a plurality of registers, each provided to a corresponding one of said at least one programming circuit and including a second fuse which is blown when an address is programmed in the corresponding programming circuit, and each for outputting a signal selected from a first level when the second fuse is blown and a second level when the second fuse is not blown, wherein
   said first determination circuit generates the output signal based on output signals from said plurality of registers.

7. The semiconductor memory device according to claim 5, further comprising:
   a second determination circuit for determining whether the at least one programming circuit stores an address corresponding to a defective memory cell that is found after said semiconductor memory device is packaged, and for outputting a signal of a level according to a result of determination.

8. The semiconductor memory device according to claim 7, wherein
   said first determination circuit generates the output signal to indicate no availability to replace a defective memory cell with the at least one spare memory cell in response to the signal generated by said second determination circuit indicating that an address stored in the at least one programming circuit corresponds to a defective memory cell that is found after said semiconductor memory device is packaged.

* * * * *